(12) United States Patent
Arlt (10) Patent No.: US 11,867,711 B2
(45) Date of Patent: Jan. 9, 2024

(54) PROCESS AND APPARATUS FOR AUTOMATIC MEASUREMENT OF DENSITY OF PHOTOPOLYMER PRINTING PLATES

(71) Applicant: Esko-Graphics Imaging GmbH, Itzehoe (DE)

(72) Inventor: Klaus Walter Arlt, Itzehoe (DE)

(73) Assignee: Esko-Graphics Imaging GmbH, Itzehoe (DE)

( * ) Notice: Subject to any disclaimer, the term of this patent is extended or adjusted under 35 U.S.C. 154(b) by 212 days.

(21) Appl. No.: 16/972,276

(22) PCT Filed: May 25, 2020

(86) PCT No.: PCT/EP2020/064384
§ 371 (c)(1),
(2) Date: Dec. 4, 2020

(87) PCT Pub. No.: WO2020/239665
PCT Pub. Date: Dec. 3, 2020

(65) Prior Publication Data
US 2022/0349796 A1 Nov. 3, 2022

Related U.S. Application Data (60) Provisional application No. 62/854,544, filed on May 30, 2019.

(51) Int. Cl.
*G01N 9/24* (2006.01)
*B41N 3/00* (2006.01)
*G03F 7/12* (2006.01)

(52) U.S. Cl.
CPC .............. *G01N 9/24* (2013.01); *B41N 3/00* (2013.01); *G03F 7/12* (2013.01)

(58) Field of Classification Search
CPC ...... G01N 21/3103; B41N 1/14; B41N 1/083; B41N 3/034; B41N 1/08; B41N 1/12;
(Continued)

(56) References Cited

U.S. PATENT DOCUMENTS 3,970,393 A * 7/1976 Krygeris ................ G01N 21/86
250/559.1
5,888,697 A 3/1999 Fan
(Continued)

FOREIGN PATENT DOCUMENTS

CN 101256362 A 9/2008
CN 102520578 A 6/2012
(Continued)

OTHER PUBLICATIONS

Chinese Office Action with Search Report for Chinese Application No. 202080003688.2, dated Mar. 7, 2023 with translation, 15 pages.
(Continued)

*Primary Examiner* — Michael P Stafira
(74) *Attorney, Agent, or Firm* — RatnerPrestia (57) ABSTRACT

A method and apparatus for measurement of density of a photosensitive printing plate (130) having a mask (132) embodying image information corresponding to an image to be printed. A density measurement system includes a first radiation source (112) spaced apart from and adjacent the plate and configured to emit radiation having a first wavelength or range of wavelengths toward the plate. A densitometer (110) spaced apart from and adjacent the plate in a fixed relationship relative to the first radiation source receives and measures an amount of the first radiation transmitted through or reflected by the plate and the mask during relative movement between the plate and the density measurement system. The densitometer readings are processed to provide an output correlating to quality of the mask. The density measurement system may be coupled to an exposure system (120,122,124) for curing the plate.

32 Claims, 6 Drawing Sheets

(58) Field of Classification Search
CPC . B41N 3/08; B41N 3/03; B41N 1/003; B41N 3/038; B41N 1/22; B41N 2210/02; B41N 2210/04; B41N 1/24; B41N 1/086; B41N 1/16; B41N 3/00; B41N 1/006; B41N 1/247; B41N 1/06; B41N 1/10; B41N 3/036; G03F 7/11; G03F 7/033; G03F 7/027; G03F 7/004; G03F 7/031; G03F 7/00; G03F 7/029; G03F 7/322; G03F 7/0045; G03F 7/3035; G03F 7/09; G03F 7/32; G03F 7/202; G03F 7/0388; G03F 7/105; G03F 7/0007; G03F 7/092; G03F 7/20; G03F 7/038; G03F 7/032; G03F 7/091; G03F 7/07; G03F 1/68; G03F 7/035; G03F 7/002; G03F 7/2018; G03F 7/2055; G03F 7/095; G03F 1/56; G03F 7/039; G03F 7/0955; G03F 7/022; G03F 7/325; G03F 7/40; G03F 7/0047; G03F 7/16; G03F 7/2022; G03F 7/12; G03F 7/2006; G03F 7/38; G03F 7/327; G03F 7/168; G03F 7/2014; G03F 7/0295; G03F 1/58; G03F 1/60; G03F 7/0042; G03F 7/028; G03F 7/26; G03F 7/0752; G03F 7/115; G03F 7/24; G03F 7/3064; G03F 7/2002; G03F 7/2004; G03F 7/3071; G03F 7/066; G03F 7/0757; G03F 7/18; G03F 7/016; G03F 7/0325; G03F 7/037; G03F 7/0392; G03F 7/2043; G03F 7/30; G03F 7/305; G03F 7/0166; G03F 7/0212; G03F 7/063; G03F 7/0002; G03F 7/0005; G03F 7/06; G03F 7/14; G03F 7/405

See application file for complete search history.

(56) References Cited

U.S. PATENT DOCUMENTS

| 6,180,325 B1 * | 1/2001 | Gelbart | G03F 7/24 430/935 |
|---|---|---|---|
| 8,389,203 B2 | 3/2013 | Sievers | |
| 8,578,854 B2 | 11/2013 | Sievers | |
| 9,352,544 B2 | 5/2016 | Frenkel et al. | |
| 9,658,526 B2 | 5/2017 | Lin et al. | |
| 2005/0170264 A1 | 8/2005 | Hukuhara | |
| 2012/0237871 A1 | 9/2012 | Zwadlo | |
| 2014/0282290 A1 | 9/2014 | Rieger et al. | |
| 2016/0059540 A1 * | 3/2016 | Smith | B41F 5/12 101/483 |
| 2016/0229172 A1 | 8/2016 | Stebani et al. | |
| 2016/0355004 A1 | 12/2016 | Blomquist et al. | |
| 2017/0087766 A1 | 3/2017 | Chung et al. | |
| 2018/0004093 A1 | 1/2018 | Fronckiewicz et al. | |
| 2018/0203356 A1 | 7/2018 | Muhlfeit et al. | |
| 2018/0210345 A1 | 7/2018 | Wolterink et al. | |
| 2018/0329300 A1 | 11/2018 | Lee et al. | |
| 2019/0340740 A1 * | 11/2019 | Li | G06V 10/98 |
| 2020/0023632 A1 | 1/2020 | Boyksen | |

FOREIGN PATENT DOCUMENTS

| CN | 103459155 A * | 12/2013 | B41F 33/00 |
|---|---|---|---|
| CN | 106324982 A | 1/2017 | |
| EP | 0734148 A1 | 9/1996 | |
| EP | 0816920 A2 | 1/1998 | |
| EP | 0871025 A1 * | 10/1998 | |
| EP | 0884582 A1 * | 12/1998 | |
| EP | 1557279 A2 | 7/2005 | |
| EP | 1744883 B1 * | 4/2011 | B41F 33/0036 |
| EP | 2481583 A2 * | 8/2012 | B41C 1/05 |
| GB | 2283092 A * | 4/1995 | B41F 33/0036 |
| JP | H07102681 B2 * | 11/1995 | |
| JP | H10178516 A * | 6/1998 | |
| JP | 2005022111 A * | 1/2005 | |
| WO | 2018096144 A1 | 5/2018 | |
| WO | 2018172374 A1 | 9/2018 | |

OTHER PUBLICATIONS

International Preliminary Report on Patentability and Written Opinion for International Application No. PCT/EP2020/064384, dated Nov. 16, 2021, 10 pages.

Gaklin et al., "Optical monitoring of laser engraved flexo plates", SPIE, vol. 5447, Feb. 16, 2005, pp. 134-142.

International Search Report and Written Opinion for International Application PCT/EP2020/064384, dated Sep. 1, 2020, 13 pages.

* cited by examiner

PROCESS AND APPARATUS FOR AUTOMATIC MEASUREMENT OF DENSITY OF PHOTOPOLYMER PRINTING PLATES

CROSS-REFERENCE TO RELATED APPLICATIONS

This patent application is a U.S. National Phase Patent Application of PCT Application No. PCT/EP2020/064384, filed May 30, 2020, which claims priority to U.S. Provisional Application Ser. No. 62/854,544, titled PROCESS AND APPARATUS FOR AUTOMATIC MEASUREMENT OF DENSITY OF PHOTOPOLYMER PRINTING PLATES, filed May 30, 2019, incorporated herein by reference.

BACKGROUND OF THE INVENTION

Many processes are known in the art for preparing polymer printing plates, such as photopolymer flexographic plates and letterpress printing plates coated with photopolymer material. One known process uses a Laser Ablative Mask System (LAMS) plate having a laser ablatable layer disposed on a front side of the plate, imaging the plate in a digital imager using a modulated laser beam to ablate the LAMS layer according to imaging data to create a mask, and then curing the exposed plate by exposing the plate through the LAMS layer mask to actinic radiation, including but not limited to radiation in the ultraviolet (UV) wavelength range.

Various processes for curing the plate on both the imaged side and the back side of the plate by exposure to a functional energy source are known, including methods for providing a blanket exposure (such as with fluorescent light tubes that emit UV light), and methods for providing the desired radiation using light emitting diode (LED) technology, such as is described in U.S. Pat. No. 8,389,203, assigned to the assignee of the present application and incorporated by reference. One particularly useful LED arrangement is shown and described in U.S. Pat. No. 8,578,854, also incorporated herein by reference.

Although the laser beam used for ablating the LAMS layer is a tool free of wear, it is still subject to a series of shortcomings. For example, dust or any other kind of deposition on the optical system can affect focus spot positions or quality and cause the image to be blurry or fuzzy. Quality may also suffer if the plate thickness used for imaging is not the same as the thickness for which the system is calibrated (such as by using the wrong plate, or by entering the wrong plate thickness into the computer controller for the imager). Sometimes, decay in laser power causes improper mask openings in the LAMS layer. Mistakes in prepress job preparation may cause wrong gradation of the screens. In short, there are many chances of failure in the imaging process in LAMS based systems as well as in other types of mask creation systems, such as thermal- or film-based systems, which may cause tremendous costs if they are not detected in an early stage.

It is known to check the imaging quality of flexographic photopolymer printing plates by density measurement of the mask's transmission using certain test patterns. Such proofing is typically performed manually, after imaging, but before performing further process steps. However, certain advantages may be provided by automating the quality check and/or checking quality prior to exposing the printing plates to radiation.

SUMMARY OF THE INVENTION

Exemplary embodiments of the invention include an apparatus for automatic measurement of density of photopolymer printing plate. The apparatus includes a printing plate comprising a photosensitive polymer prepared for activation by exposure to radiation. The printing plate includes a non-printing back side and a printing front side having a mask embodying image information relating to an image to be printed. The apparatus also includes a density measurement system including a first radiation source and a densitometer. The first radiation source is spaced apart from and adjacent the plate and configured to emit a first radiation having a first wavelength or range of first wavelengths toward the plate. The densitometer is spaced apart from and adjacent the plate in a fixed relationship relative to the first radiation source. The densitometer is configured to receive and measure an amount of the first radiation transmitted through or reflected by the plate and the mask. The apparatus also includes a substrate configured to receive the printing plate in a position to receive the first radiation. The apparatus further includes a means for causing relative movement between the printing plate and the density measurement system and a density measurement processor configured to process information from the densitometer relating to the amount of measured radiation received over a predetermined region of the printing plate. The processor also provides an output regarding quality of the mask based upon the processed information.

In one embodiment, the apparatus densitometer is disposed in a housing unit adjacent the second side of the plate.

In another embodiment, the densitometer and a second radiation source is disposed in the housing unit In a further embodiment, an imaging system includes the apparatus, a laser system for ablating a laser-ablated mask (LAM), a LAM processor for controlling the laser system based upon the image information, and a computer memory containing a set of computer readable instructions defining the image information.

DETAILED DESCRIPTION OF THE INVENTION

Figure 1A:
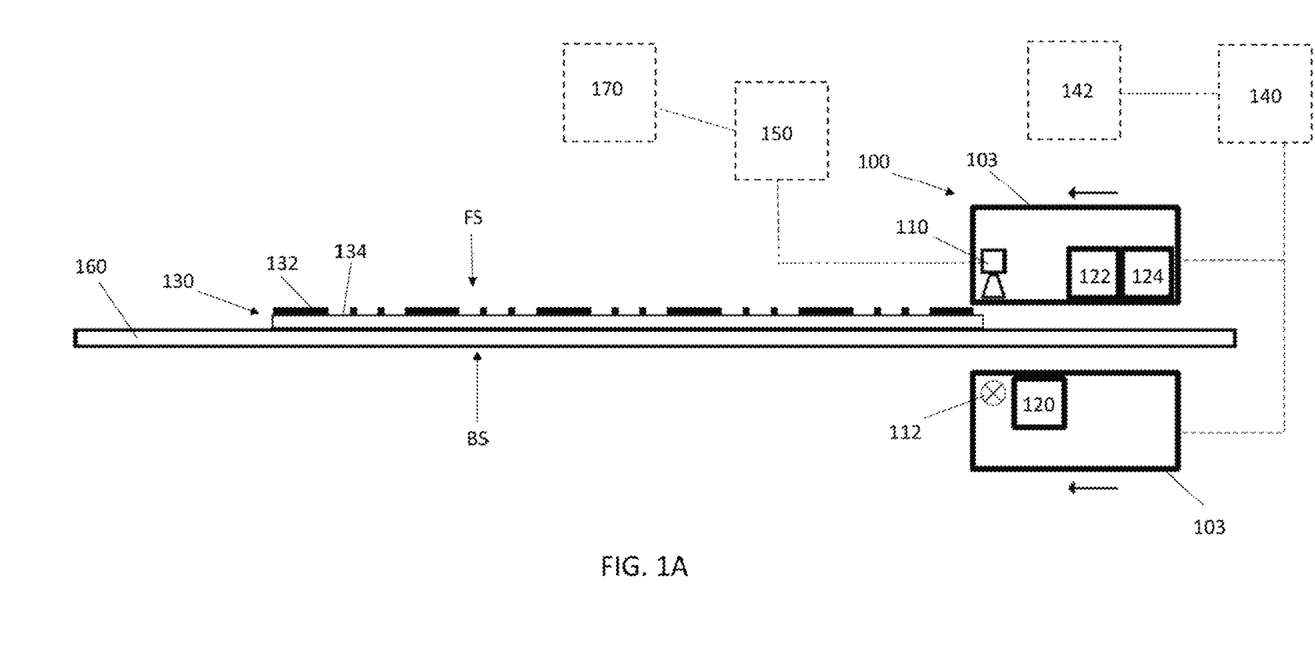
FIG. 1A is a schematic drawing depicting an exemplary apparatus for measurement of density of photopolymer printing plate in accordance with aspects of the invention.

An exemplary apparatus 100 for coordinated front and back exposure of a photosensitive printing plate 130 and having an exemplary density measurement system in accordance with one aspect of the present invention is shown schematically in FIG. 1A. As is well known in the art, printing plate 130 comprises a photosensitive polymer 134 on which is disposed a mask 132 that defines portions of the plate masked from radiation exposure relative to portions of the plate desired to receive such exposure. The mask 132 may comprise a laser-ablated mask (LAMS) layer, as described herein above and as is known in the art. In a typical embodiment, the polymer 134, including in the mask 132 area, is permeable to oxygen. The plate 130 may be mounted on a transparent substrate 160 (such as glass).

In the apparatus 100, a density measurement system includes a density measurement radiation source 112 and a densitometer 110 positioned to receive radiation transmitted through the plate 130. The density measurement radiation source 112 emits radiation having a first wavelength or range of wavelengths. Although, only one density measurement system is shown, apparatus 100 may include multiple density measurement radiation systems. Densitometer 110 is disposed in a housing 103 and is spaced apart from and adjacent a front side of the plate (FS), sometimes also referred to as the main side or printing side of the plate, in a fixed relationship relative to the density measurement radiation source 112. Source 112 is disposed in a housing 104 and spaced apart from and adjacent a back (or non-printing) side of the plate BS. The densitometer 110 measures an amount of the first radiation transmitted through a pre-determined region of the plate 130.

In one embodiment, apparatus 100 may further include one or more curing sources of actinic radiation 122, 124, for curing the plate from the front side, disposed adjacent to the densitometer 110 inside housing 103. One or more curing sources of actinic radiation 120, for curing the plate from the back side, are similarly disposed adjacent the density radiation source 112 inside housing 104. Although, multiple front side curing radiation sources 122, 124 are shown, other embodiments may have only a single curing source on the front side. Likewise, although only a single back side curing radiation source 120 is depicted, other embodiments may have multiple back side curing sources.

Relative movement between the plate 130 and the density measurement system is triggered by a drive mechanism 140 controlled by a controller/control system 142, as is known in the art. In one embodiment, the plate 130 is fixed and the drive mechanism 140 moves the housing units 103/104. In another embodiment (not shown), the housing units 103/104 are fixed and the drive mechanism 140 moves the plate 130. Housings 103 and 104 may be attached to a common carriage that traverses the plate 130, with sources 120 and 122 spaced apart from one another a suitable distance in the direction of carriage travel to provide the desired delay when the carriage moves at a predetermined speed.

Curing sources 120, 122, 124 may be linear sources that cover an area at least coextensive with a width of the plate (wherein the "width" lies along the third dimension not shown in the 2-dimensional image of FIG. 1A) but not coextensive with a full length of the plate (wherein the "length" lies in the X direction as shown in FIG. 1A, wherein the linear sources are moved along the length of the plate. Each linear source may comprise a plurality of sub-sources (such as LED point sources) that together collectively create the linear radiation field having a defined length less than the length of the printing plate, and a width that spans at least the entire width of the printing plate.

Sources 120, 122, 124 of actinic radiation emit a wavelength or a range of wavelengths (e.g. in the UV range) that is different than the radiation emitted by the density measurement source 120 (which preferably emits a wavelength or range of wavelengths that is non-actinic—does not cure—the plate polymer 134). Thus, for example, for a photopolymer plate comprising UV-curable polymer, the actinic radiation emitted by the curing sources will be in the UV range, typically in a range of about 320 nm to about 450 nm, more preferably within the range of about 360 nm to about 420 nm. However, the invention is not limited to any particular wavelength or range thereof. The sources of actinic radiation may include multiple species of sources, each species emitting in a narrow distribution around a different center wavelength. The density measurement may comprise a wavelength that has good range of transmissivity through the photopolymer and LAMS layer material of the plate, but not actinic to the photopolymer (and not at a wavelength, intensity, or combination thereof capable of modifying the LAMS layer). While not limited to any particular wavelength or range thereof, standard densitometers operate in the range of visible light (approximately 400 nm-700 nm), so suitable density measurement systems preferably comprise a source of light having a wavelength above 450 nm and below 700 nm) and a densitometer capable of operation at the source wavelength.

A density measurement processor 150 may be coupled to the densitometer 110 via any type of data interface known in the art. The density measurement processor 150 may be located inside or outside of housing 103. The density measurement processor 150 receives information from the densitometer 110 relating to the amount of measured density measurement radiation received over the pre-determined region of the plate 130. The density measurement processor 150 processes the information and provides an interpretation of the results based on the processed information, as described in greater detail herein below. In some embodiments, the density measurement processor may be in communication with the LAMS system 170 used for imaging the mask.

Figure 1B:
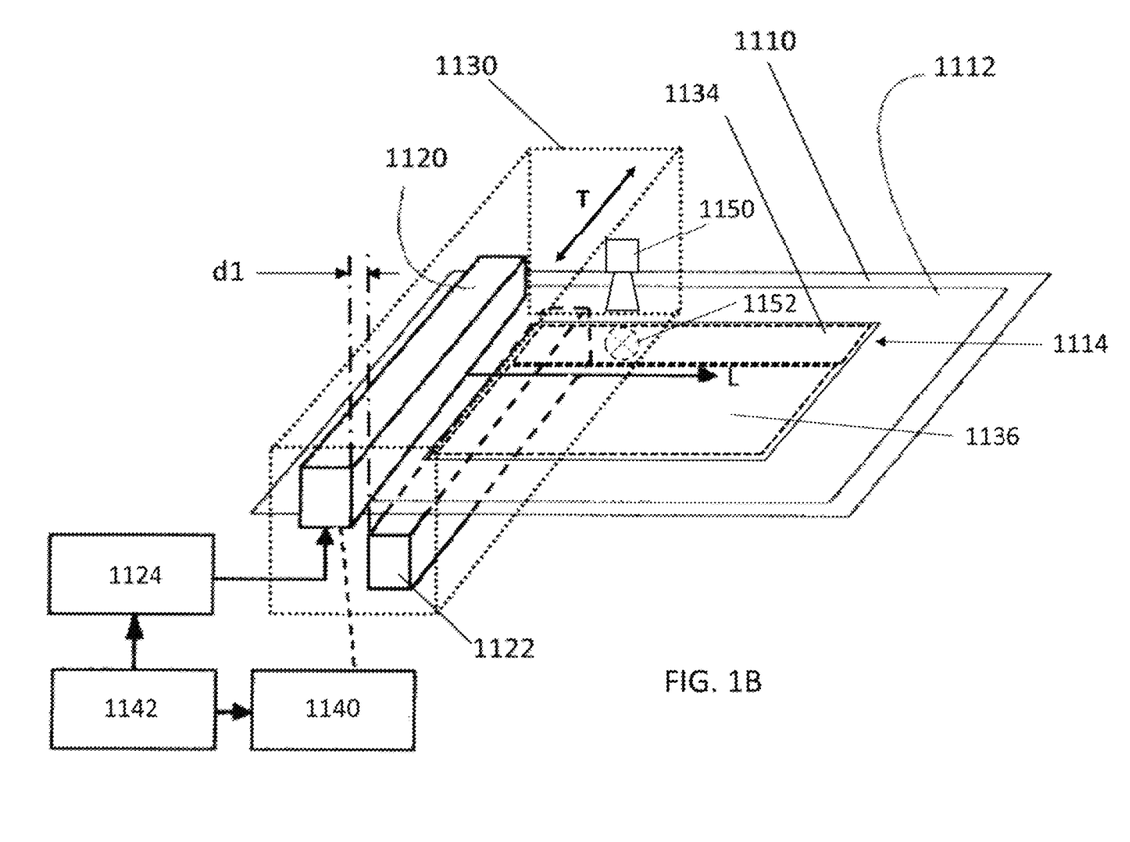
FIG. 1B is a schematic drawing depicting an exemplary apparatus for measurement of density of photopolymer printing plate integrated with linear exposure sources in a flatbed system.

In the embodiment depicted in FIG. 1B, carriage 1130 represents a mechanism for moving both the front side actinic curing radiation source 1120 and back side linear radiation source 1122 relative to plate 1114 mounted on transparent surface 1112, such as a glass plate. Carriage 1130 may comprise a single housing split in the middle to accommodate the plate between an upper housing portion and a lower housing portions (e.g. upper housing 103 and lower housing 104 housings depicted in FIG. 1A, respectively). Each of the actinic radiation sources 1120, 1122 extend to cover one dimension of the plate, which in the example shown shall be referred to as the transverse direction. The carriage traverses the plate in the longitudinal (or lateral) direction along arrow L, with at least one source, and preferably both sources, activated. While the exposure step may be performed in a single pass, in some embodiments the exposure may be performed in a plurality of passes, in which each pass imparts radiation using both banks of sources at a fraction of the total exposure needed to provide a desired amount of exposure. Source 1120 is depicted as a single source in FIG. 1B to reduce clutter, but may comprise more than one source (such as in the embodiment depicted in FIG. 1A). Multiple sources may be used on the front side versus back side due to the relatively greater amount of exposure generally used on the front side relative to the back side, in practice.

The overall mechanism for creating the exposure may comprise a table having an outer frame 1110 that holds a transparent (e.g. glass) stage 1112 on which plate 1114 is disposed. In one embodiment, the upper portion of the carriage 1130 (disposed above the plate) holds the densitometer 1150 and the lower portion of the carriage holds density measurement radiation source 1152. However, the relative positions above and below the plate of the source and the densitometer may be reversed. The positions of the densitometer 1150 and density measurement radiation source 1152 may be stationary, or the densitometer 1150 and density measurement radiation source may be fixed relative to one another, but configured to traverse the carriage 1130 in the transverse direction in the direction of arrow T using any mechanism for providing such motion as is known in the art. The radiation sources are coupled to a power source 1124, such as an electrical power cord having sufficient slack to extend the full range of motion of the carriage. Tracks (not shown) disposed on the outer frame portion provide a defined path for the gantry system or carriage to traverse. The carriage may be moved on the tracks by any drive mechanism 1140 known in the art (also coupled to the power supply 1124 and the controller 1142), including a chain drive, a spindle drive, gear drive, or the like. The drive mechanism for the carriage may comprise one or more components mounted within the carriage, one or more components fixed to the table, or a combination thereof. A position sensor (not shown) is preferably coupled to the carriage to provide feedback to the controller regarding the precise location of the carriage at any given time. The control signal output from the controller for operating the radiation sources and for controlling motion of the carriage may be supplied via a wired or wireless connection. The controller may be mounted in a fixed location, such as coupled to the table with a control signal cable attached to the sources similar to the power cable, or may be mounted in or on the carriage. The control system and drive mechanism cooperate to cause back and forth relative motion in a transverse direction between the light from the radiation sources and the plate. If should be understood that other embodiments may include a drive mechanism configured to move the portion of the table containing the plate past stationary upper and lower linear radiation sources, as well as embodiments in which the radiation sources cover less than the full width of the plate and are movable in both the transverse and longitudinal direction to provide total plate coverage (or the plate is movable in both directions, or the plate is movable in one of the two directions and the sources are movable in the other direction to provides the full range of motion required to cover the entire plate).

Figure 2A:
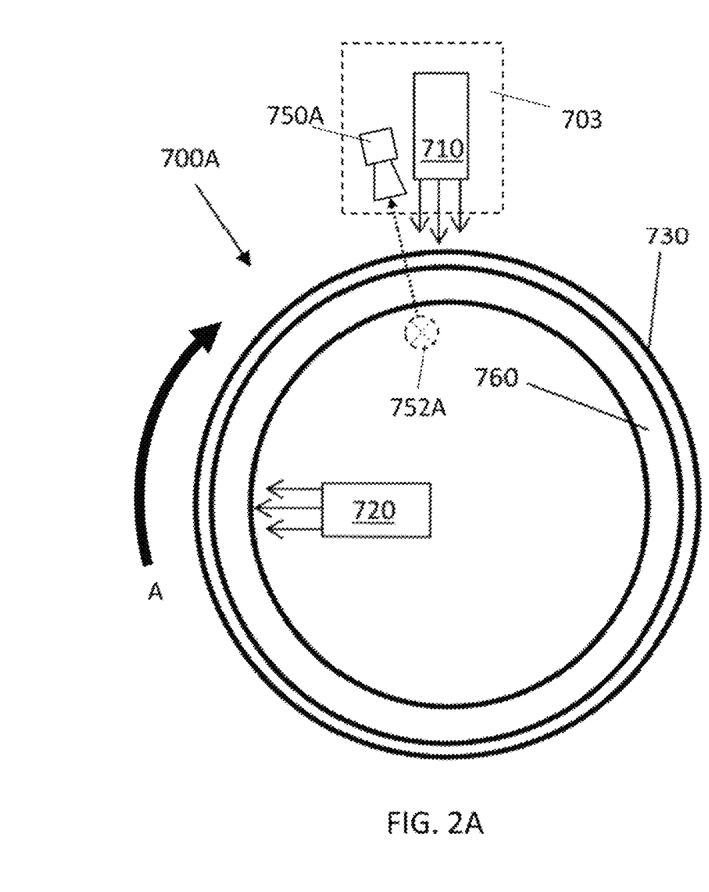
FIG. 2A is a schematic drawing depicting an exemplary apparatus for automatic measurement of density of photopolymer printing plate in a drum-based exposure system using a transmission densitometer.

Furthermore, although shown in a flat orientation, it should be understood that the printing plate may be flexible enough to be disposed around a transparent cylinder, such as a glass cylinder, or the plate may be in the form of a continuous sleeve, as is known in the art, with the distances between the light sources arranged relative to the rotational direction of the cylinder, as generally depicted in FIG. 2A and described in more detail herein later.

In one embodiment 700A depicted in FIG. 2A, the printing plate 730 may be mounted on a transparent (e.g. glass) cylinder 760 rotating at a predetermined speed along arrow A, with the main radiation source 710 disposed in a first location along the cylindrical path of rotation adjacent the external surface of the cylinder, and the back side radiation source 720 disposed in a second location along the cylindrical path of rotation adjacent the internal surface of the cylinder, with the respective locations of the sources spaced apart by the distance required to provide a desired time delay between back and front exposure for the given speed of rotation. Sources 710 and 720 may be linear sources, or sources configured to travel parallel to the axis of rotation of the drum while the drum rotates.

Density measurement source 752A is disposed opposite densitometer 750A. The density measurement system defined by source 752A and densitometer 750A may be stationary, or may move in a transverse direction parallel to the axis of rotation of the drum. Although depicted with the source 752A positioned with densitometer 750A housed in a common housing 703 with actinic curing radiation source 710, the invention is not limited to any particular disposition of the density measurement system. In other embodiments, the positions of the source 752A and the densitometer 750A may be reversed, or the density measurement system components 750A, 752A may be disposed so that one or the other component may be commonly housed with source 720. In still other embodiments, the density measurement system may be positioned along the circumference of the cylinder in any position desired. In such a system, the location of the actinic radiation sources and/or the speed of rotation may be variable to provide variable time delays, in which case the density measurement system components are preferably in a fixed position, or positioned such that they retain a fixed relationship with one another, notwithstanding any repositioning of the actinic radiation sources. In embodiments in which the actinic radiation sources have a limited range of movement to provide variable time delay, the density measurement components may be freestanding in a position that does not interfere with the range of movement of the actinic radiation components. The photosensitive printing plate 730 may be a sleeve, such as a sleeve designed to fit over the transparent cylinder 760 of the system described above, or may be flat, but sufficiently flexible, to permit it to be disposed on and secured to the surface of the cylinder. It should be understood that the term "transparent" as used herein may refer to any material that permits a desired amount of radiation at the desired wavelength pass through the selected material. Thus, "transparent" as used herein, may refer to a material that is not visibly transparent or even translucent to the human eye.

Figure 2B:
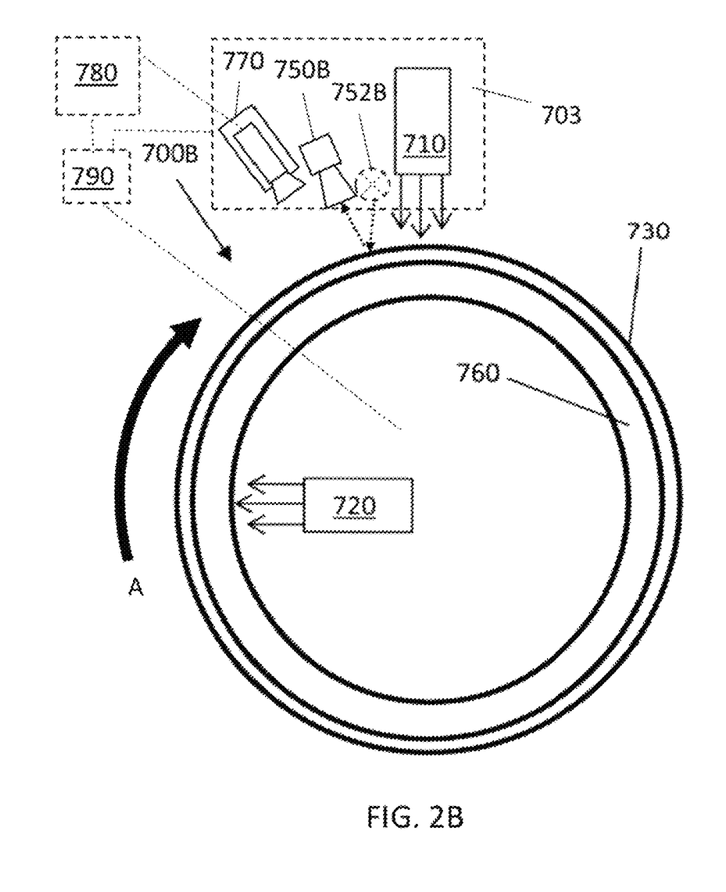
FIG. 2B is a schematic drawing depicting an exemplary apparatus for automatic measurement of density of photopolymer printing plate in a drum-based exposure system using a reflection densitometer.

As depicted in FIGS. 1A, 1B, and 2A, the densitometer is a transmission densitometer. Embodiments using reflection densitometers that provide the source and densitometer on the same side of the plate as the mask (i.e. the printing side) may also be used for practicing aspects of the invention. FIG. 2B depicts an embodiment 700B comprising a reflection densitometer, in which the source 752B is positioned not to emit light through the plate, but rather to reflect light off of the relevant portion of the plate (and mask) towards the densitometer 750B. The system 700A depicted in FIG. 2A is in every way otherwise identical to system 700B depicted in FIG. 2B. Although depicted in a drum arrangement, it should be understood that a reflection densitometer configuration may also be used in a flatbed system as depicted in FIGS. 1A and 1B, in configurations that are identical to those depicted in FIGS. 1A and 1B, but with the source and densitometer disposed on the same side (i.e. front, mask side) of the plate in a reflective arrangement. A suitable densitometer may include a TECHKON DENS made by TECHKON GmbH of Konigstein, Germany, which is capable of use in transmission or reflection modes.

The relative movement between the combined density measurement/curing radiation sources and the plate may be provided by any mechanism known in the art for moving objects relative to a horizontal, vertical, or otherwise disposed stationary objects. For configurations in which the combined density measurement/curing radiation sources move and the plate is stationary, for example, the sources may be disposed on a gantry system having arms that pass the respective sources on the relevant side(s) of a stationary plate. For configurations in which the combined density measurement/curing radiation sources are stationary and the plate is movable, for example, the plate may be mounted on any mechanism known in the art, such as a movable stage configured to move relative to fixed density measurement/curing radiation sources on opposite sides of the stage. The density measurement system may also be applied to mechanisms for rotating a cylinder on which a plate is mounted relative to fixed sources/density measurement system. Similarly, mechanisms for rotating sources relative to a fixed cylinder on which the plate is mounted may also be used. Thus, mechanisms for moving one or more elements relative to another are well known in the art, generally, and the invention is not limited to any particular mechanism. By way of example, a density measurement system as described herein may be integrated with any of the mechanisms for providing relative movement between a plate and front/back curing exposure sources as discussed in U.S. Patent Application Publication No. 2018/0210345, titled PROCESS AND APPARATUS FOR CONTROLLED EXPOSURE OF FLEXOGRAPHIC PRINTING PLATES AND ADJUSTING THE FLOOR THEREOF, assigned to the common assignee of the present invention, and incorporated herein by reference in its entirety.

As described herein, LAMS system 170 may be coupled to the densitometer 110. The LAMS system 170 may comprise a processor coupled to computer memory and configured to control the laser system used for formation of an image in the LAMS layer based upon computer readable image information stored in the computer memory. Special control marks or test targets suitable for measuring certain density properties of the LAMS layer are preferably added to the image engraved by the laser beam into the mask. These test targets are preferably located in a predetermined, non-essential area of the mask, such as an area that are later are not used and can be cut off for printing, or do not appear at visible positions of the final package, such as at the edges of the image. Thus, the image information sent to the laser beam includes not only image information for causing the laser system to generate an image in an essential image area of the plate (e.g. area 1136 depicted in FIG. 1B), but also for imaging a predetermined density measurement target (such as the target 300 depicted in FIG. 3) in an non-essential image area 1134 outside of the essential image area. The relative sizes of the non-essential image area 1134 and essential image area 1136 of the plate are exaggerated in FIG. 1B, for emphasis. Thus, while the density measurement system may be configured to traverse the plate area to enable measurement on any location on the plate, in preferred embodiments, the density measurement system is fixed in a location that coincides with the location of the target on the plate. However, in systems in which the location of the target may have to change for various reasons, the density measurement system may be controllable to traverse the target wherever the target is located.

The control of a moveable density measurement system may be automated, such as controlled by a controller and positioner, or manual, such as moveable by a human operator to a fixed location corresponding to an expected location of the target for a large run of plates. In automated systems, a machine vision system may be used for detecting the exact location of the target, the mask opening associated with the target, and positioning the density measurement system in the correct location to take the desired readings. Suitable machine vision systems, such as is depicted in the embodiment 700B shown in FIG. 2B, may comprise a camera 770 for capturing an image of at least an area of the front of the plate in the expected area of the target, coupled to a processor 780 for determining location and orientation of the target, coupled to a positioner and movement mechanism 790 for positioning the density measurement system relative to the plate to read the target. While depicted in the figures in FIG. 2B for illustration, machine vision systems are generally well known in the art, and may be implemented in any of the other embodiments depicted and described herein. For example, the OMS 4.0 Optical Measuring System from Systec of Nuremberg, Germany, is suitable for implementation as described above. Systems including machine vision components may also use the machine vision system for assisting with accurate positioning of the densitometer over a desired area, as the machine vision can be used to ensure the actual area being measured has the expected image information that matches expectations based upon machine coordinates, and can help compensate for misalignment. Machine vision may also be used for detecting whether the beam is properly focused by analyzing the border between ablated and non-ablated areas. Analysis of the presence of lines or dust remaining in 100% ablated areas may also be used to provide information about the balancing of the beams or correct positioning of the beam rake.

Figure 3:
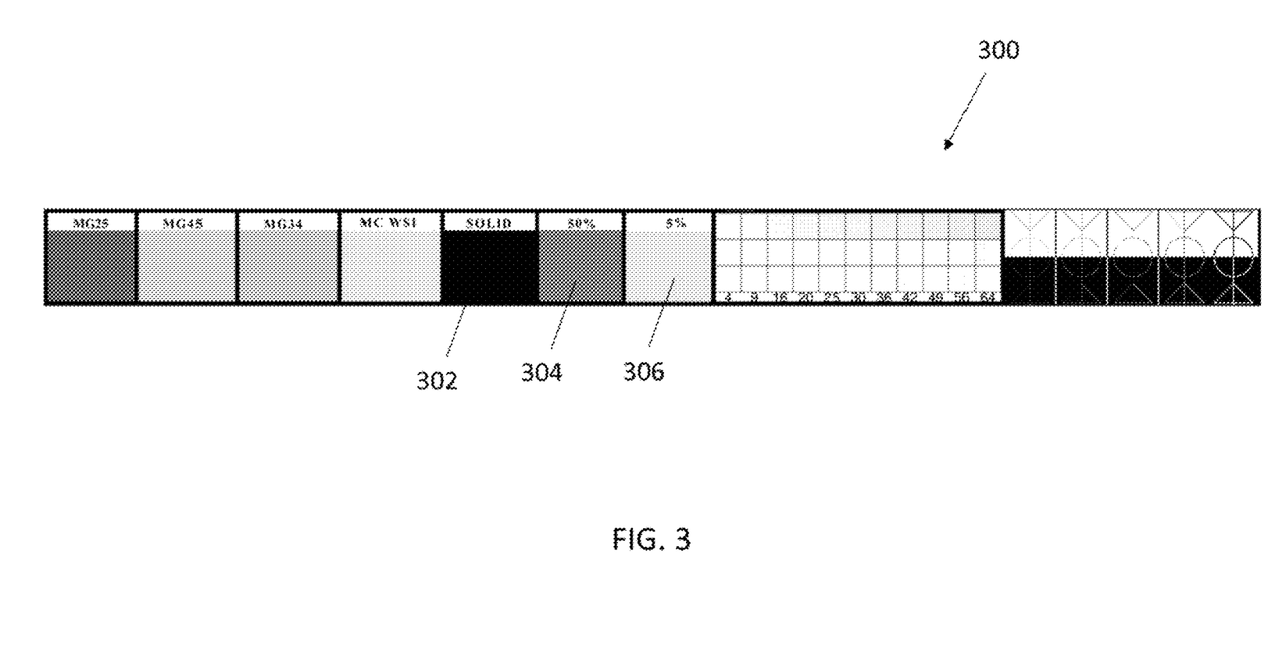
FIG. 3 is a schematic illustration depicting an exemplary target for imaging on the plate for use with the exemplary density measurement systems.

The target depicted in FIG. 3 shows a negative of the image information. Black areas in the test target stand for complete ablation, while white areas represent non ablated areas. After processing, black areas remain on the plate (because the complete ablation allows the actinic radiation to cure the plate polymer, making it stable during a washing step, while the white (non-ablated) areas are removed (because they are not cured by the actinic radiation, and thus are fully removed during the post-exposure processing (e.g. washing) step. The density measurement target 300 contains at least one 100% transmissivity (or 100% reflectivity, for reflection densitometer systems) area (e.g. area 302), at least one mid transmissivity (or mid reflectivity) area 304, and at least one low transmissivity (or low reflectivity) area 306. The transmissivity (or reflectivity) of the low transmissivity (or low reflectivity) area is less than the transmissivity (or reflectivity) of the mid transmissivity (or mid reflectivity) area. In one embodiment, the mid transmissivity (or mid reflectivity) area has 50% transmissivity (or 50% reflectivity) and the low transmissivity area has 5% transmissivity (or 5% reflectivity). Target 300 may be a target dedicated to use by the density measurement system, or may comprise portions of a target used for quality control in downstream portions of the process. Additionally or instead of using a target, the system as described herein may be used for analyzing one or more portions of the image area. As is well understood by those of skill in the art, the grey level and the corresponding expected density for all areas of the image as imaged into the LAMS layer are known from the imaging process. Accordingly, the system can compare the actual density reading in one or more places of the imaged mask with the expected density readings based upon information in the image file. In systems that include machine vision, the camera can detect an image area corresponding to a predetermined density based on detected mask openings (e.g. in the test strip depicted in FIG. 3, machine vision is capable of detecting where the 50% and 100% areas are located within the strip), the density measurement system can measure the actual density in the identified area, and the expected to actual density can be compared without necessarily having to check image information (although such systems may refer to image information and camera readings). Camera densitometer systems having the capabilities as described herein include Flex3Pro from Peret GmbH of Varna, Italy or vipFLEX from X-Rite, Incorporated of Grand Rapids, Michigan, USA. Target 300 preferably has a size suitable for reading by a fixed density measurement system within a degree of tolerance for plate placement. For example, while the imaging step may require precise positioning of a plate, the exposure step may have more tolerance for misalignment. Accordingly, the size of the target relative to a fixed location of the density measurement system is selected to ensure proper reading of the target, regardless of alignment within the acceptable range of tolerance for alignment.

The density measurement processor 150 may use readings of the densitometer at the 100% transmissivity/reflectivity area to calibrate the instrument for the specific plate, then measure transmissivity through the mid (e.g. 50%) transmissivity/reflectivity area. If the density measurement correlates to more than the expected mid-range (e.g. 50%) ablation, the laser power may be too high; if less than the expected amount, the laser power may be too low. Transmissivity through/reflectivity from the low transmissivity/reflectivity area may be used for characterizing optical quality, including focus of the laser system. If the focus is wrong, the mask opening will be below 5%. Only if everything is adjusted well (focus, laser power and cleanliness of the optics) will the reading of the densitometer in the 5% region corresponding to a mask opening of 5%. Mask opening percentages lower than 5% may also be used for this test in particularly sensitive systems. The density measurement system as described herein may also be used for measuring the so-called "stain level"—namely the remaining density on a 100% ablated area as compared to an area with no LAMS layer at all. An area with no LAMS layer for analysis may be created by any method known in the art, including but not limited to removal by a stripe of tape (e.g. 3M duct tape) or by imaging several times at 100% on the same spot.

If the analysis by the density measurement processor 150 determines that the readings gathered by the density measurement system are in an acceptable range, then the plate processing is continued to include the exposure step to the actinic radiation that cures the polymer. If the analysis by the density measurement processor 150 determines that the readings gathered by the density measurement system are not in an acceptable range, then an exception is noted, and the LAMS system is inspected and any problems corrected. A new printing plate and a mask having the same image information are then created with the corrected system and re-tested.

Figure 4:
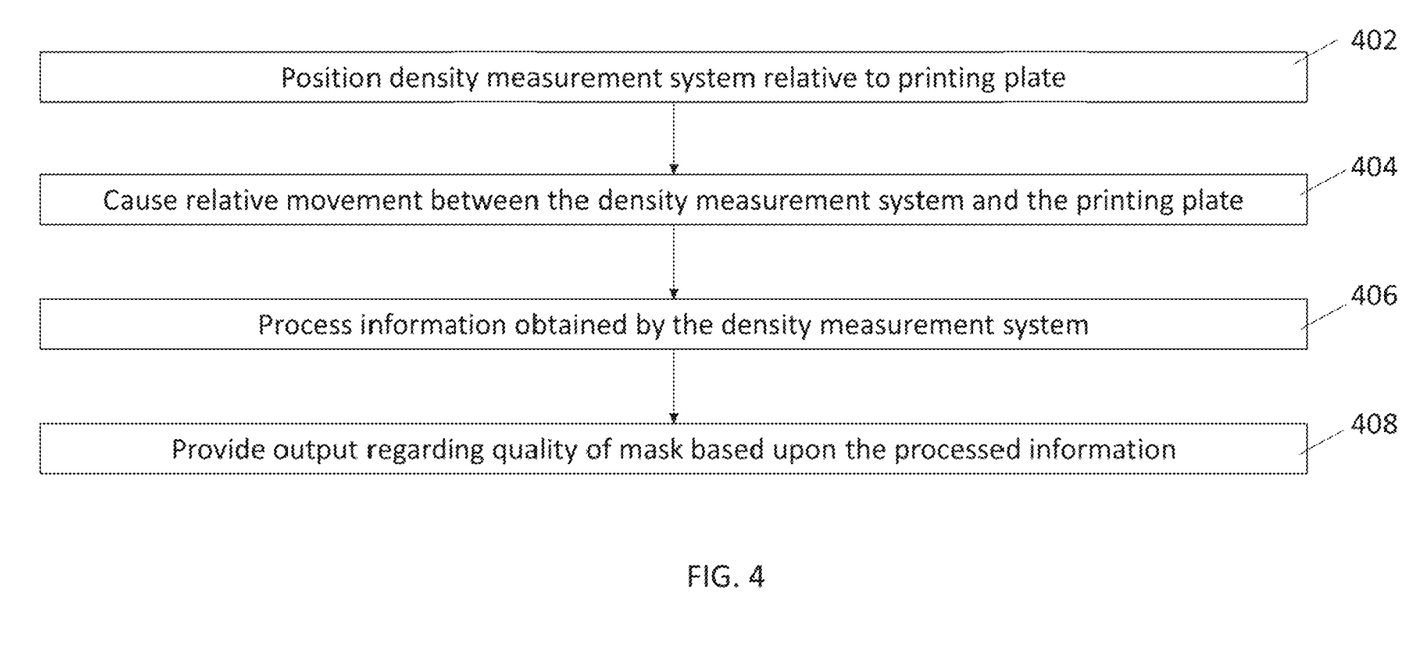
FIG. 4 is a flowchart depicting an exemplary method of the invention.

FIG. 4 is a flowchart depicting an exemplary method 400 for checking quality of a mask creation system in accordance with aspects of the invention. In step 402, the density measurement system as described herein is disposed relative to the printing plate. In step 404, the method comprises causing relative movement between the printing plate and the density measurement system while the first radiation source emits the first radiation and the densitometer receives and measures the amount of the first radiation transmitted through or reflected by the plate and mask. In step 406, information from the densitometer relating to the amount of measured radiation received over a predetermined region of the printing plate is processed. Step 408 comprises providing an output regarding quality of the mask, based upon the processed information. The information from step 408 may then be used for adjusting features of the imaging (e.g. LAMS) step, or for authorizing further processing pursuant to the exposure step.

It should be understood that the arrangement depicted in FIGS. 1A, 1B and 2 are schematic in nature only. In a system 100 in which printing plate 130 is disposed along a horizontal plane (i.e. in which directional arrow Y of the X-Y axis shown in FIG. 1 represents the directional pull of gravity), plate 130 may be mounted on a transparent substrate 160 (such as glass). In a system 100 in which printing plate 130 is disposed along a vertical plane (i.e. a system in which directional arrow X of the X-Y axis represents the directional pull of gravity), the plate may be hung vertically (such that no substrate under the plate or other structure between the radiation source and the plate are required), such as from a holder (not shown).

Figure 5:
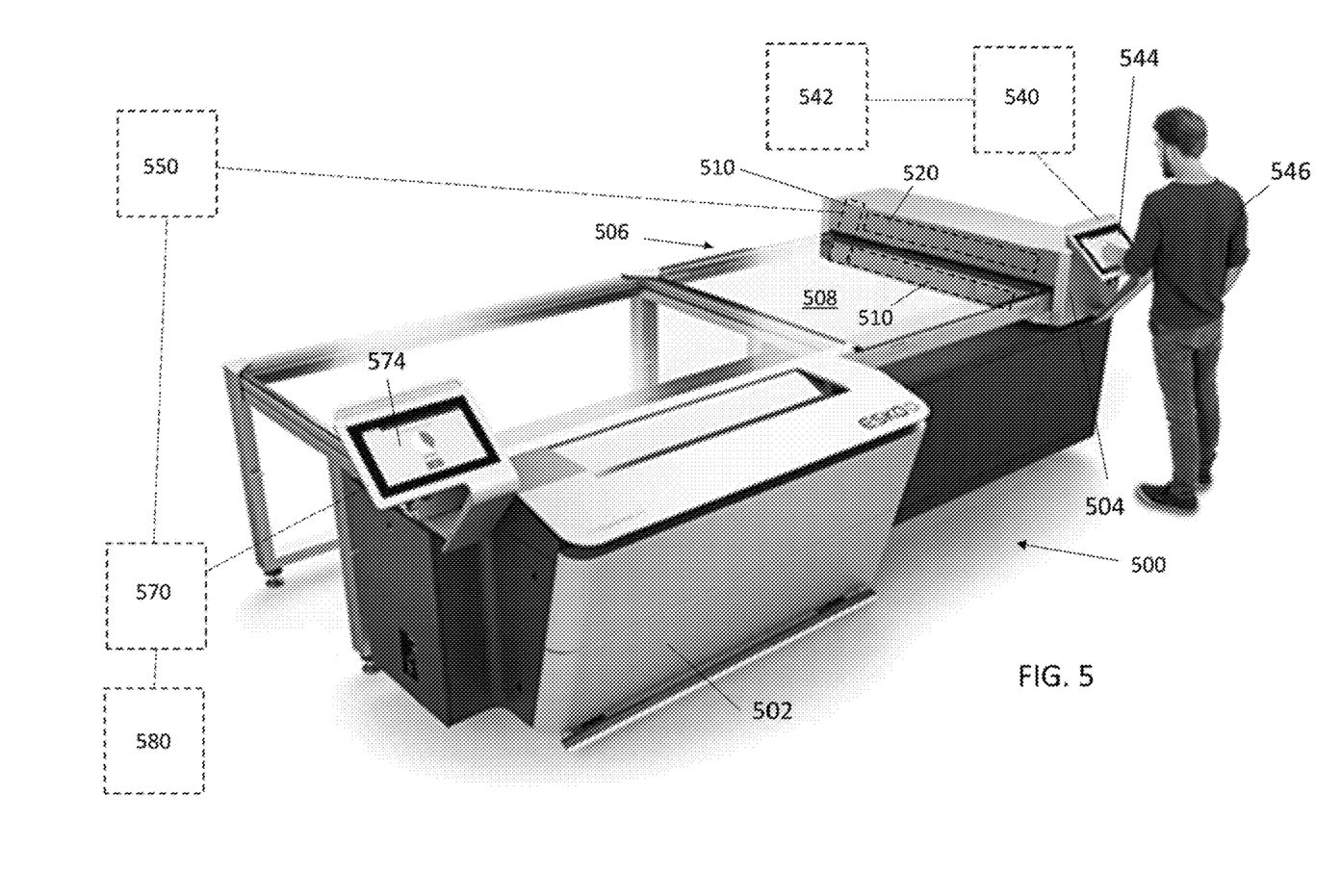
FIG. 5 is a schematic drawing depicting an integrated imaging and exposure system showing aspects of an exemplary apparatus for measurement of density of photopolymer printing plate.

An exemplary work flow configuration 500 is depicted in FIG. 5. Imaging system 502 is controlled by processor 570, which may be in communication with densitometer processor 550. Densitometer processor 550 is configured to receive and analyze information from the density measurement system 510 integrated into carriage 504 of exposure station 506. Exposure station 506 includes an exposure table comprising a glass substrate 508 for receiving a plate for conducting the exposure step as described herein. Carriage 504 traverses the plate longitudinally, driven by a movement mechanism 540 controlled by exposure system controller 542. In the exemplary system, carriage 504 comprises a housing in which are disposed a linear UV front 520 source (disposed above the glass substrate 508) and linear UV back source 522 (disposed below the glass substrate 508). The density measurement system 510 includes a density radiation source and a densitometer positioned as described herein. The imaging system processor 570 provides instructions to the imaging system corresponding to image information stored in computer memory 580, which information includes information for imaging a target on the plate (such as the target shown in FIG. 3) in a predetermined area (typically a non-essential image area) of the plate. The target is read by the density measurement system 510 and analyzed by the density measurement processor 550. In some embodiments, information from the density measurement processor 550 may be communicated to the imaging system process 570 to automatically adjust laser power based upon the densitometer readings. In other embodiments, information regarding density readings may be output on a display 544 readable by a human operator 546. The human operator may then commence a process for troubleshooting imager 502 to look for the source of the exceptions reported. The information regarding changes to be made may be displayed on a display 544 associated with the exposure station 506 or on a display 574 associated with the imaging system 502, or on any display associated with the workflow, including displays remote from the physical machines and used for monitoring the workflow. Data captured by the density measurement system 510 and analysis performed by the processor 550 may also be stored in a computer memory associated with the workflow. As depicted, the imaging system is a drum-based LAMS, and the exposure system is a linear UV LED flatbed exposure system. The workflow may include additional components upstream and downstream of the components shown, and the components shown may have numerous features not shown or described.

It should be understood that the invention is not limited to any physical embodiment, and that the method of the invention of incorporating automating density measurement may be performed in any system having any physical configuration. In particular, the invention is not limited to LAMS mask creation systems, but is applicable to any type of imaging systems for creating a mask, including but not limited to thermal- or film-based systems.

Although the exemplary apparatus and systems as illustrated and described provide for automating the density measurement utilizing the UV sources, it should be understood that various exposure systems may be devised to provide the automated density measurement. In such exemplary systems, the UV light sources may comprise, for example and without limitation, LEDs, arrays of LEDs, fluorescent lights, such as fluorescent tubes, arc discharge lamps, or any other UV light source known in the art. Although described herein in connection with a UV system and referring to "UV light", it should be understood that the technology described herein is not specific to any particular type of radiation wavelength, visible or non-visible, and that the system may utilize any type of actinic radiation or other radiation that is functional to cause the photochemical reaction necessary to cure the type of plate used, and any non-actinic radiation (relative to the curing radiation for the polymer) for reading density. Thus, the term "light source" as used herein refers to any type of actinic radiation source.

When a method has been described herein including several steps, no ordering of such steps is implied, unless specifically stated.

Embodiments of the present invention are not limited to any particular implementation, and that the invention may be implemented using any appropriate techniques for implementing the functionality described herein. Furthermore, embodiments are not limited to any particular operating system.

Reference throughout this specification to "one embodiment" or "an embodiment" means that a particular feature, structure or characteristic described in connection with the embodiment is included in at least one embodiment of the present invention. Reference to "exemplary" components refers to examples only, which examples are intended to be non-limiting. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill skilled in the art from this disclosure, in one or more embodiments.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified, the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

Similarly, the term coupled, when used in the claims, should not be interpreted as being limitative to direct connections only. The terms "coupled" and "connected," along with their derivatives, may be used. Thus, the scope of the expression a device A "coupled" to a device B is not be limited to devices or systems wherein device A is directly connected to device B. It means that there exists a path between the device A and the device B which may be a path including other devices or means. "Coupled" may mean that two or more elements are either in direct physical or electrical contact, or that two or more elements are not in direct contact with each other but yet still cooperate or interact with each other. For example, any of the various components of computer systems as described herein may comprise multiple computer processors, memories, displays, user interfaces, and the like, which may be connected to a network that is wired, wireless, or some combination thereof, including via the internet with at least some components "in the cloud."

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

What is claimed:

1. An apparatus for preparing a printing plate, the printing plate comprising a photosensitive polymer activated by exposure to actinic radiation and having a non-printing back side and a printing front side, the front side having a mask embodying image information relating to an image to be printed, the apparatus comprising:
    a density measurement system comprising:
    a first radiation source spaced apart from and adjacent the plate and configured to emit a first radiation having a first wavelength or range of wavelengths toward the plate;
    a densitometer spaced apart from and adjacent the plate in a fixed relationship relative to the first radiation source, the densitometer configured to receive and measure an amount of the first radiation transmitted through or reflected by the plate and the mask;
    a substrate configured to receive the printing plate in a position to receive the first radiation;
    means for causing relative movement between the printing plate and the density measurement system; and
    a density measurement processor configured to process information from the densitometer relating to the amount of measured radiation received over a predetermined region of the printing plate and to provide an output regarding quality of the mask based upon the processed information.

2. The apparatus of claim 1, wherein the mask comprises a laser-ablated mask created in a layer modulated by laser ablated mask system, and the output regarding quality of the mask correlates to characteristics of the laser ablated mask system.

3. The apparatus of claim 1, wherein the first radiation source is positioned adjacent the non-printing back side of the plate and the densitometer is positioned adjacent the printing front side of the plate.

4. The apparatus of claim 1, wherein the first radiation source is positioned adjacent the printing front side of the plate on which the mask is disposed and the densitometer is positioned adjacent the non-printing back side.

5. The apparatus of claim 1, further comprising a camera system positioned adjacent to the printing front side of the plate on which the mask is disposed.

6. The apparatus of claim 5, wherein the densitometer is a reflection densitometer and the source and densitometer are also positioned adjacent to the printing front side of the plate on which the mask is disposed.

7. The apparatus of claim 1, further comprising one or more curing radiation sources positioned to expose one or both sides of the plate to a second radiation having a second wavelength or range of wavelengths different from the first wavelength or the range of wavelengths, said second wavelength or range of wavelengths operative to cure the photosensitive polymer and said first wavelength or range of wavelengths not operative to cure the photosensitive polymer.

8. The apparatus of claim 7, wherein the printing plate is fixed and a drive mechanism is configured to move the density measurement system and the one or more curing radiation sources.

9. The apparatus of claim 7, wherein the density measurement system and the one or more curing radiation sources are fixed and a drive mechanism is configured to move the plate.

10. The apparatus of claim 7, further comprising a substrate on which the plate is disposed, wherein the substrate is at least partially transparent to the first radiation.

11. The apparatus of claim 10, wherein the densitometer is a transmission densitometer and the substrate is also at least partially transparent to the second radiation.

12. The apparatus of claim 1, wherein the substrate is cylindrical and the relative movement comprises a rotational movement.

13. The apparatus of claim 12, wherein the printing plate comprises a sleeve.

14. The apparatus of claim 1, wherein the substrate comprises a planar transparent horizontal surface.

15. The apparatus of claim 14, wherein the means for causing relative movement comprises a carriage to which the densitometer and radiation sources are mounted.

16. An imaging system comprising the apparatus of claim 1 and a laser ablated mask system configured to laser ablate the mask in a layer of the plate in accordance with image information, and the output regarding quality of the mask correlates to characteristics of the laser ablated mask system.

17. The imaging system of claim 16, further comprising a processor for controlling the laser ablated mask system based upon image information, and a computer memory containing a set of computer readable instructions defining the image information, wherein the image information includes information for causing the laser system to image a predetermined target in a position on the plate accessible by the density measurement system.

18. The imaging system of claim 17, wherein the predetermined target contains at least one 100% transmissivity or reflectivity area, at least one mid transmissivity or reflectivity area, and at least one low transmissivity or reflectivity area, wherein the transmissivity or reflectivity of the low transmissivity or reflectivity area is less than the transmissivity or reflectivity of the mid transmissivity or reflectivity area.

19. The imaging system of claim 18, wherein the mid transmissivity or reflectivity area has 50% transmissivity or reflectivity and the low transmissivity or reflectivity area has 5% transmissivity or reflectivity.

20. The imaging system of claim 18, wherein the density measurement processor is configured to evaluate a density reading corresponding to the mid transmissivity or reflectivity area to characterize laser power of the laser system.

21. The imaging system of claim 18, wherein the density measurement processor is configured to evaluate a density reading corresponding to the low transmissivity or reflectivity area to characterize optical quality of the laser system.

22. A method for checking quality of a mask creation system in a system for preparing a printing plate comprising a photosensitive polymer activated by exposure to radiation, the printing plate having a non-printing back side and a printing front side having a mask embodying image information corresponding to an image to be printed, the method comprising the steps of:
  a) positioning a density measurement system relative to the printing plate, the density measurement system comprising:
    a first radiation source spaced apart from and adjacent the plate and configured to emit a first radiation having a first wavelength or range of wavelengths toward the plate;
    a densitometer spaced apart from and adjacent the plate in a fixed relationship relative to the first radiation source, the densitometer configured to receive and measure an amount of the first radiation transmitted through or reflected by the plate and the mask;
  b) causing relative movement between the printing plate and the density measurement system while the first radiation source emits the first radiation and the densitometer receives and measures the amount of the first radiation transmitted through or reflected by the plate and the mask; and
  c) processing information from the densitometer relating to the amount of measured radiation received over a predetermined region of the printing plate and providing an output correlating to quality of the mask based upon the processed information.

23. The method of claim 22, further comprising if the output correlating to the quality of the mask is acceptable, then exposing one or both sides of the plate to second radiation having a second wavelength or range of wavelengths different from the first wavelength or the range of wavelengths, wherein said second wavelength or the range of wavelengths is actinic radiation that cures the photosensitive polymer.

24. The method of claim 22, further comprising if the output correlating to the quality of the mask is not acceptable, then making changes in the mask creation system before generating another printing plate and mask having the same image information.

25. The method of claim 24, wherein the mask creation system is a laser ablated mask system (LAMS) and the output of correlating to the quality of the mask indicates a deficiency in the LAMS, the method further comprising correcting the LAMS responsive to the output correlating to the quality of the mask before creating another mask having the same image information on another printing plate.

26. The method of claim 22, further comprising causing the mask creation system to create a predetermined target on the plate in the predetermined region of the printing plate, and measuring the amount of the first radiation transmitted through or reflected by the predetermined target.

27. The method of claim 26, comprising causing the mask creation system to create the predetermined target with at least one 100% transmissivity or reflectivity area, at least one mid-transmissivity or reflectivity area, and at least one low-transmissivity or reflectivity area, wherein the transmissivity or reflectivity of the low transmissivity or reflectivity area is less than the transmissivity or reflectivity of the mid transmissivity or reflectivity area.

28. The method of claim 27, comprising characterizing imaging properties of the mask creation system based upon density measurements in the mid transmissivity or reflectivity area of the predetermined target.

29. The method of claim 28, wherein the mask creation system is a LAMS, comprising characterizing laser power of a laser system.

30. The method of claim 27, comprising characterizing optical quality of the imaging system based upon density measurements in the low transmissivity or reflectivity area of the predetermined target.

31. The method of claim 22, comprising checking the density on an imaged layer of a polymer printing plate at one or more locations on the image and comparing the density readings with corresponding information in the image file correlated to an expected density measurement.

32. The method of claim 22, comprising determining whether to continue processing of the plate based upon the output correlating to quality of the mask.

* * * * *